United States Patent
Yamazaki et al.

(10) Patent No.: US 10,893,641 B2
(45) Date of Patent: Jan. 12, 2021

(54) GROUP DETERMINATION METHOD AND GROUP DETERMINATION APPARATUS

(71) Applicant: Panasonic Intellectual Property Management Co., Ltd., Osaka (JP)

(72) Inventors: Takuya Yamazaki, Fukuoka (JP); Atsushi Nakazono, Kanagawa (JP); Hiroshi Ando, Kanagawa (JP); Kazuyoshi Harada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 297 days.

(21) Appl. No.: 15/866,703

(22) Filed: Jan. 10, 2018

(65) Prior Publication Data

US 2018/0206372 A1 Jul. 19, 2018

(30) Foreign Application Priority Data

Jan. 17, 2017 (JP) ................................. 2017-005558

(51) Int. Cl.
  *H05K 13/08* (2006.01)
  *G06Q 50/04* (2012.01)
  *B23K 101/42* (2006.01)

(52) U.S. Cl.
  CPC ........ *H05K 13/085* (2018.08); *B23K 2101/42* (2018.08); *G06Q 50/04* (2013.01); *Y02P 90/30* (2015.11)

(58) Field of Classification Search
  CPC .............................. H05K 13/08; H05K 13/085
  See application file for complete search history.

(56) References Cited

U.S. PATENT DOCUMENTS

10,345,792 B2 * 7/2019 Yamazaki ........ G05B 19/41865

FOREIGN PATENT DOCUMENTS

| JP | 3830642 B2 | 10/2006 | |
| JP | 2009038087 A | * 2/2009 | |
| JP | 2016042523 A | * 3/2016 | ........... H05K 13/085 |

\* cited by examiner

*Primary Examiner* — Livius R. Cazan
(74) *Attorney, Agent, or Firm* — Pearne & Gordon LLP

(57) ABSTRACT

A group determination method includes a step of calculating an external set-up work time for an external set-up work by which a component supplier used in a group that is a next production target of a group under production in a component mounting line, including a plurality of the component mounters capable of attaching and detaching a component supply carriage which can arrange a plurality of the component suppliers (tape feeders), is removed from the component mounting line and arranged in the component supply carriage; and a step of calculating a production completion time at which the production of all the mounting boards that are the production targets is completed in consideration of the external set-up work time. A plurality of groups which are common in an arrangement of component suppliers for the mounting boards that are the production targets are determined so that production completion time is shortened.

4 Claims, 9 Drawing Sheets

M3(M4,M5,M6)

(12) United States Patent

GROUP DETERMINATION METHOD AND GROUP DETERMINATION APPARATUS

BACKGROUND

1. Technical Field

The present disclosure relates to a group determination method and a group determination apparatus for determining a group of mounting boards which are common among a plurality of types of the mounting boards as production targets in a component arrangement of a component mounter.

2. Description of the Related Art

In a component mounting line which is configured by connecting a plurality of component mounters mounting components on boards, a plurality of types of the mounting boards are produced in order. When the plurality of types of the mounting boards are produced in the component mounting line, a so-called common arrangement, in which a component supplier that supplies components necessary for the production of the plurality of types of the mounting boards are disposed in advance in a component supply carriage capable of attaching and detaching to and from the component mounter, is performed. It is possible to continue the production without changing the component supplier on the component supply carriage by causing the arrangement of the component supplier to be the common arrangement when the mounting board that is the production target is changed (for example, see Japanese Patent No. 3830642).

In Japanese Patent No. 3830642, in the determination of the group of the mounting board to be produced in the same common arrangement, the number of the set-ups for replacing the component supplier is reduced and the group of the mounting board and the common arrangement are determined so as to shorten a set-up work time.

SUMMARY

A group determination method of the disclosure for dividing a plurality of types of mounting boards that are production targets into a plurality of groups in which an arrangement of a plurality of component suppliers is common in a plurality of component mounters, in a component mounting line including the plurality of the component mounters capable of attaching and detaching a component supply carriage which can dispose the plurality of the component suppliers for supplying components, the method including an external set-up work time calculation step of calculating an external set-up work time for an external set-up work by which the component suppliers to be used in a group that is a next production target of a group under production in the component mounting line is arranged in the component supply carriage removed from the component mounting line; and a production completion time calculation step of calculating a production completion time at which production of all the mounting boards that are the production targets is completed in consideration of the external set-up work time. The plurality of the groups are determined so that the production completion time is shortened.

A group determination apparatus of the disclosure, which divides a plurality of types of mounting boards that are production targets into a plurality of groups in which an arrangement of a plurality of component supplier is common in a plurality of component mounters, in a component mounting line including the plurality of the component mounters capable of attaching and detaching a component supply carriage which can dispose the plurality of the component suppliers for supplying components, the apparatus including an external set-up work time calculator which calculates an external set-up work time for an external set-up work by which the component suppliers to be used in a group that is a next production target of a group under production in the component mounting line is arranged in the component supply carriage removed from the component mounting line; a production completion time calculator which calculates a production completion time at which production of all the mounting boards that are the production targets is completed in consideration of the external set-up work time; and a group determination unit which determines the plurality of the groups so that the production completion time is shortened.

According to the disclosure, it is possible to determine a group of a common arrangement capable of obtaining higher productivity than that in the related.

DETAILED DESCRIPTIONS

Prior to describing embodiments, a problem in the related art will be briefly described. In the related art including Japanese Patent No. 3830642, the set-up work is executed and the mounting board is produced according to the common arrangement of the group of the mounting board which is determined so as to reduce the number of the set-ups or the set-up work time, but it is not considered the time for the external set-up work by which the component supplier is arranged in advance in the replacement component supply carriage. Therefore, the number of set-ups or the set-up work time is reduced, but the external set-up work time becomes longer, as a result, a production time may become longer. Therefore, there is a room for further improvement.

In view of the above, an object of the disclosure is to provide a group determination method and a group determination apparatus for determining a group of a common arrangement, which can obtain higher productivity than that of the related art.

Figure 3:
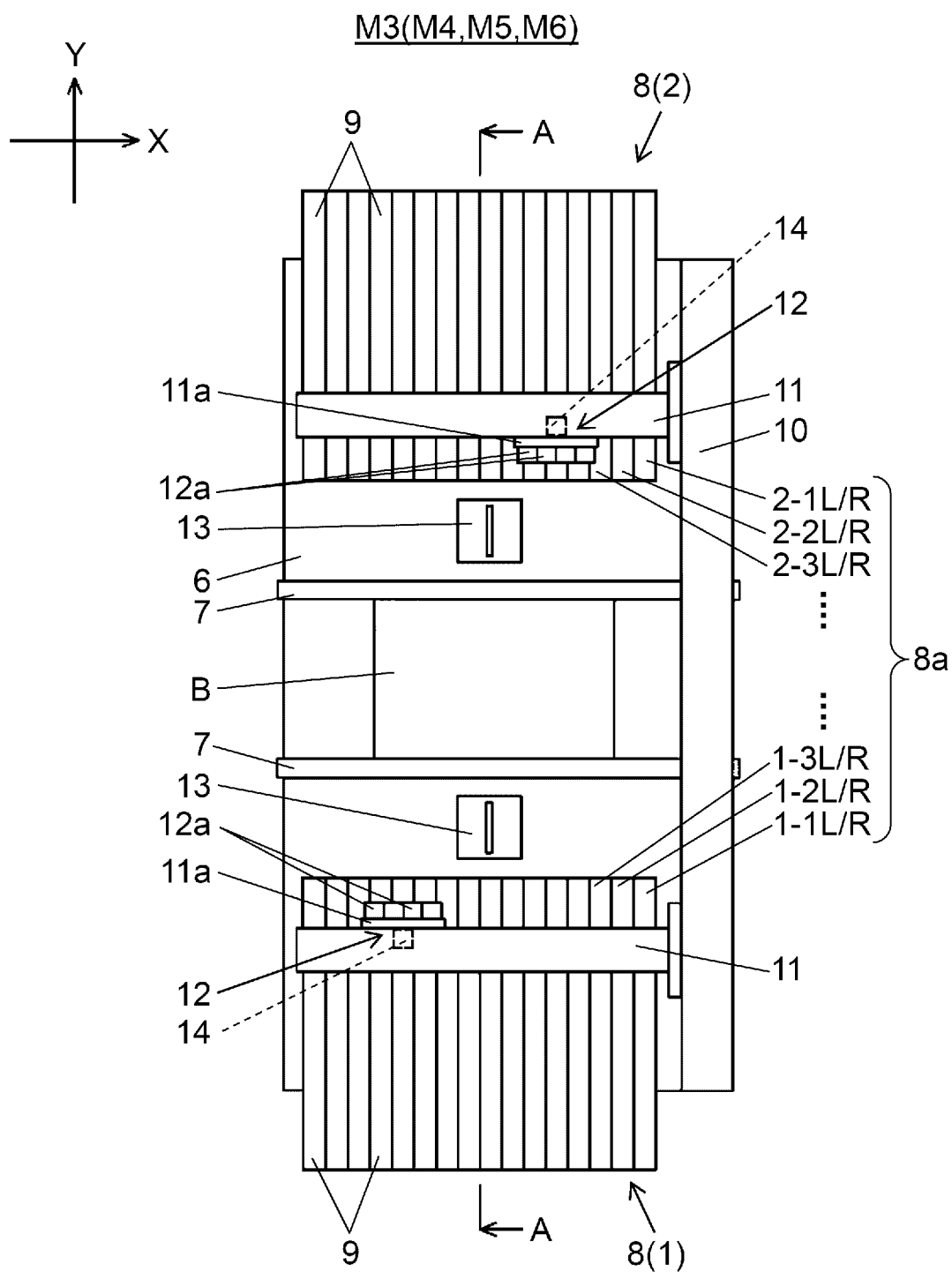
FIG. 3 is a plan view of a component mounter included in the component mounting system of an embodiment of the disclosure.
Figure 4:
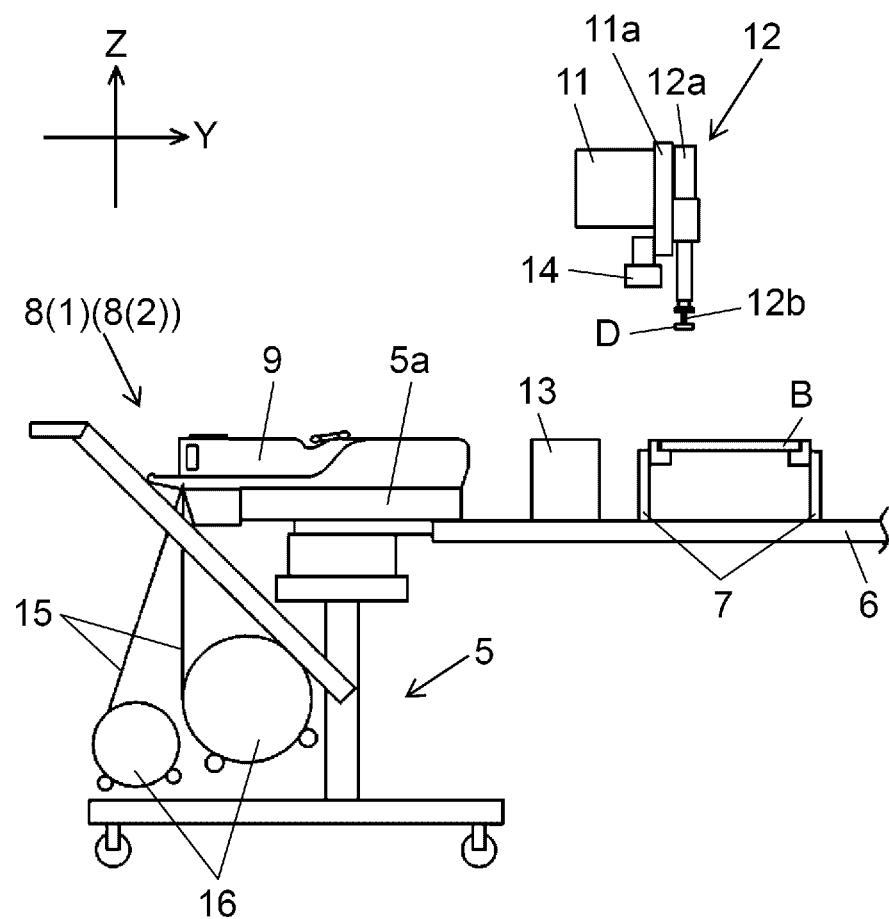
FIG. 4 is a panel sectional view of the component mounter included in the component mounting system of an embodiment of the disclosure.

Hereinafter, an embodiment will be described in detail with reference to the drawings. Configurations, shapes, and the like described below are examples for explanation, and can be appropriately changed in accordance with the specifications of the component mounting system, the component mounting line, and a component mounter. In the following description, the same reference numerals are given to corresponding elements in all drawings and redundant explanations will be omitted. In FIG. 3 and in a part to be described later, as two axial directions orthogonal to each other in a horizontal plane, an X direction (rightward and leftward direction in FIG. 3) indicates a board transport direction and a Y direction (upward and downward direction in FIG. 3) indicates a direction orthogonal to the board transport direction. In FIG. 4, a Z direction (upward and downward direction in FIG. 4) indicates a height direction orthogonal to the horizontal plane. The Z direction is the upward and downward direction or the orthogonal direction in a case where the component mounter is provided on the horizontal plane.

Figure 1:
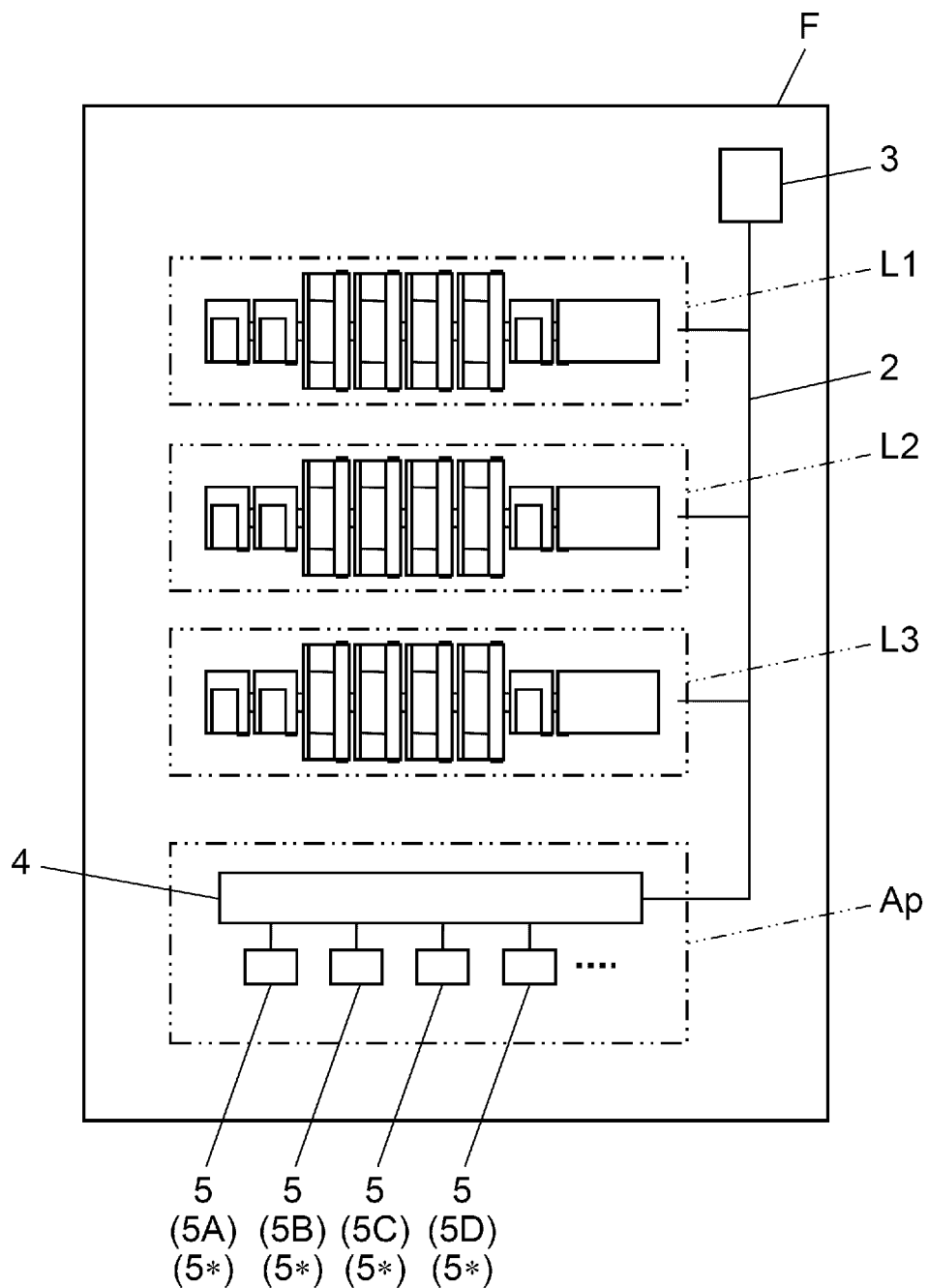
FIG. 1 is an explanatory view of a configuration of a component mounting system of an embodiment of the disclosure.

First, a configuration of component mounting system 1 will be described with reference to FIG. 1. Component mounting system 1 has a configuration in which three component mounting lines L1 to L3 disposed on floor F are connected by communication network 2 and which is managed by management computer 3. Each of component mounting lines L1 to L3 is formed by connecting a plurality of component mounting devices including the component mounters which are described later and has a function of producing a mounting board where a component is mounted on a board. That is, component mounting system 1 has component mounting lines L1 to L3 formed by connecting the plurality of the component mounting devices. Component mounting lines L1 to L3 included in component mounting system 1 is not limited to three and may be one, two, or four or more.

Set-up work support device 4 is disposed in external set-up area Ap provided on floor F. Set-up work support device 4 is connected to management computer 3 via communication network 2. Set-up work support device 4 is connected to a plurality of replacement component supply carriages 5 (here, four component supply carriages 5A, 5B, 5C, and 5D) which are targets of the set-up work. Hereinafter, replacement component supply carriage 5 is referred to as "spare carriage 5*". A plurality of tape feeders 9 (see FIG. 4) for supplying components by a worker in charge of the set-up work are installed on spare carriage 5* (component supply carriages 5) connected to set-up work support device 4. If tape feeders 9 are installed on spare carriage 5*, power is supplied to tape feeder 9 by set-up work support device 4 via spare carriage 5* and a feeder controller (not illustrated) built in tape feeder 9 is in a communicable state with management computer 3. Therefore, a status of the set-up work such as an installing status of tape feeder 9 on spare carriage 5* and a supply status of carrier tape 15 (see FIG. 4) holding component D to tape feeder 9 can be acquired in management computer 3.

As described above, in spare carriage 5* connected to set-up work support device 4, it is possible to perform the set-up work without stopping the production of the mounting board in component mounting lines L1 to L3. That is, set-up work support device 4 supports the set-up work (hereinafter, referred to as an "external set-up work") which is executed without stopping the production of the mounting board in component mounting lines L1 to L3. Spare carriage 5* (replacement component supply carriage 5) in which the external set-up work is completed is replaced with component supply carriage 5 of a replacement target installed on the component mounter in the set-up work (hereinafter, referred to as an "internal set-up work") which stops and executes the production of the mounting board in component mounting lines L1 to L3.

Figure 2:
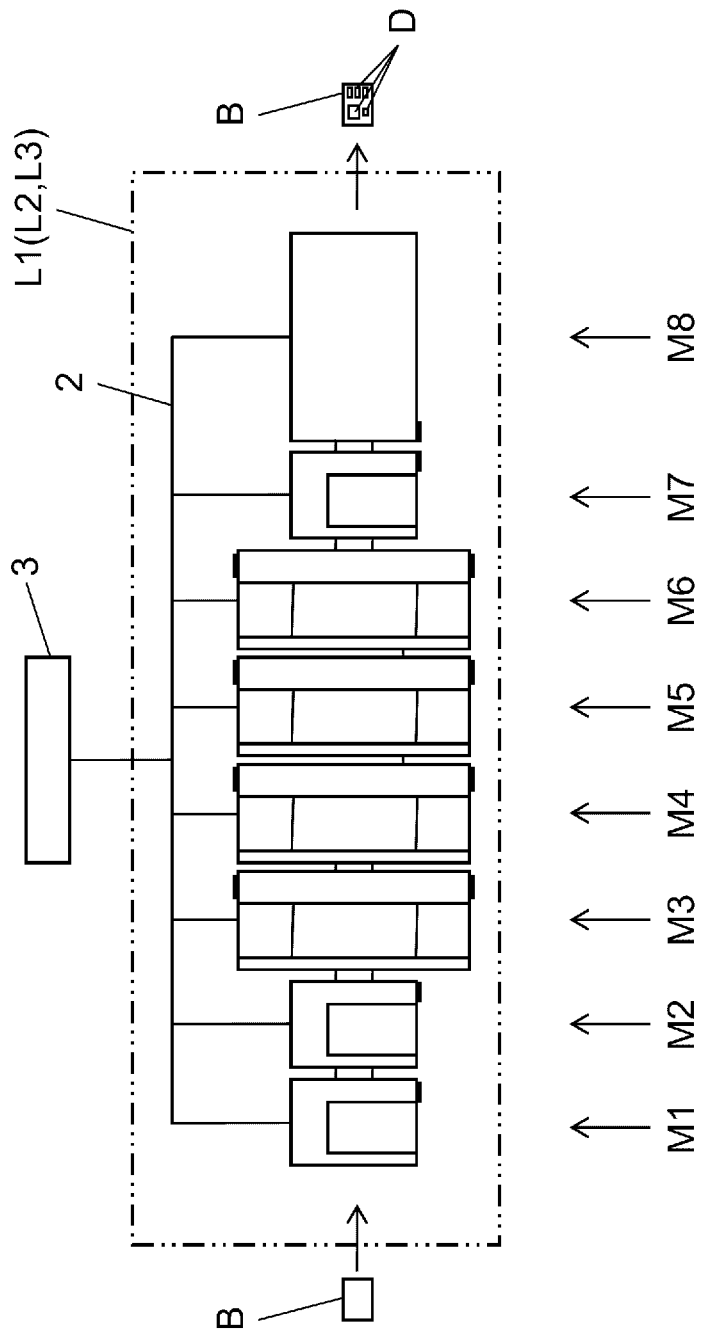
FIG. 2 is an explanatory view of a configuration of a component mounting line included in the component mounting system of an embodiment of the disclosure.

Next, a detailed configuration of component mounting lines L1 to L3 will be described with reference to FIG. 2. Component mounting lines L1 to L3 have the same configuration and hereinafter, component mounting line L1 will be described. Component mounting line L1 is formed by connecting in series the component mounting devices such as solder printing apparatus M1, printing inspection apparatus M2, component mounters M3 to M6, mounting inspection apparatus M7, and reflow apparatus M8 from an upstream side (left side of a paper surface) to a downstream side (right side of the paper surface) in the board transport direction.

Solder printing apparatus M1, printing inspection apparatus M2, component mounters M3 to M6, mounting inspection apparatus M7, and reflow apparatus M8 are connected to management computer 3 via communication network 2. Solder printing apparatus M1 executes solder printing work of printing a solder on board B, which is carried in from the upstream side by a solder printing work unit, via a mask. Printing inspection apparatus M2 executes printing inspection work for inspecting a state of a printed solder on board B by a printing inspection work unit including a solder inspection camera.

Component mounters M3 to MG execute component mounting work for mounting component D on board B by a component mounting work unit. In component mounting line L1, the number of component mounters M3 to M6 is not limited to four and component mounters M3 to M6 may be one to three, or may be five or more. Mounting inspection apparatus M7 executes mounting inspection work for inspecting a state of component D mounted on board B by a mounting inspection work unit including a component inspection camera. Reflow apparatus M8 executes a board heating work in which board B carried in the apparatus is heated by a board heater, the solder on board B is hardened, and an electrode portion of board B and component D are joined.

Next, a configuration of component mounters M3 to M6 will be described with reference to FIGS. 3 and 4. Component mounters M3 to M6 have the same configuration and here, component mounter M3 will be described. FIG. 4 partially illustrates a cross section A-A in FIG. 3. Component mounter M3 has a function of mounting component D on board B. In FIG. 3, board transport mechanism 7 is disposed at a center of base 6 in the X direction. Board transport mechanism 7 transports board B carried in from the upstream side and positions board B at a position at which the component mounting work is executed. Component supplying units 8 (1) and 8(2) are provided on both sides of board transport mechanism 7. A plurality of part feeders for supplying component D are juxtaposed and installed on component supplying units 8 (1) and 8(2). Feeder addresses 8a for specifying the installing positions of the part feeders are set in component supplying units 8 (1) and 8(2).

In the example illustrated in the embodiment, as feeder address 8a in component supplying unit 8 (1), 1-1L/R, 1-2L/R, 1-3L/R are set from a downstream side (right side in FIG. 3) to an upstream side.

It is possible to individually specify the part feeder installed on component mounter M3 by designating feeder addresses 8a. Similarly, as feeder address 8a in component supplying unit 8 (2), 2-1L/R, 2-2L/R, 2-3L/R . . . are set from the downstream side to the upstream side. The order setting method in feeder address 8a is arbitrary and the address order of component supplying units 8 (1) and 8(2) may be reversely set.

Here, an example, in which tape feeder 9 having a function of pitch-feeding a carrier tape holding a component that is a mounting target is installed as the part feeder, is illustrated. Tape feeder 9 pitch-feeds the carrier tape storing component D in a tape feeding direction thereby supplying component D at a position at which a component is picked up by a mounting head of a component mounting mechanism which is described below. That is, tape feeder 9 is a component supplier for supplying component D.

In FIG. 3, Y-axis beam 10 having a linear drive mechanism is disposed at one end portion in the X direction on an upper surface of base 6 along the Y direction. Similarly, two X-axis beams 11 having linear drive mechanisms are coupled to Y-axis beam 10 to be movable in the Y direction. X-axis beams 11 are disposed along the X direction. Mounting heads 12 are respectively installed on two X-axis beams 11 to be movable in the X direction. As illustrated in FIG. 4, mounting head 12 has a plurality of suction units 12a which are capable of ascending and descending by sucking and holding component D. Suction nozzle 12b is provided at each tip of suction units 12a.

Y-axis beam 10 and X-axis beam 11 are driven and thereby mounting head 12 moves in the X direction and the Y direction. Therefore, two mounting heads 12 suck and pick up components D from the component pick-up position of tape feeder 9 disposed in corresponding component supplying units 8 (1) and 8(2) respectively using suction nozzles 12b, thereby mounting component D on a mounting point of board B positioned in board transport mechanism 7. Y-axis beam 10, X-axis beam 11, and mounting head 12 move mounting head 12 holding component D thereby configuring the component mounting mechanism which performs mounting of component D on board B.

The mounting time until component D is picked up from tape feeder 9 and is mounted on board B depends on a distance mounting head 12 moves from tape feeder 9 to the mounting point of board B. That is, the mounting time increases and decreases depending on the position of tape feeder 9. For example, it is possible to shorten the moving distance of mounting head 12 and reduce the mounting time by performing the component arrangement so that tape feeder 9 which supplies component D, of which the number of mountings on board B, is large is located near the center of component supplying units 8 (1) and 8(2).

In FIG. 3, component recognition camera 13 is disposed between component supplying unit 8 and board transport mechanism 7. When mounting head 12 which picks up a component from component supplying unit 8 moves above component recognition camera 13, component recognition camera 13 images component D of a state of being held in mounting head 12 and recognizes a holding posture of component D. Board recognition camera 14 is attached to plate 11a to which mounting head 12 is attached. Board recognition camera 14 integrally moves with mounting head 12.

As mounting head 12 moves, board recognition camera 14 moves to above board B positioned in board transport mechanism 7 and a board mark (not illustrated) provided on board B is imaged to recognize the position of board B. In a component mounting operation on board B by mounting head 12, a mounting position is corrected taking into account a recognition result of component D by component recognition camera 13 and a recognition result of the board position by board recognition camera 14.

In FIG. 4, component supplying units 8(1) and 8(2) are configured of component supply carriage 5 where the plurality of tape feeders 9 are installed on feeder base 5a in advance. Component supply carriage 5 is detachably configured with respect to base 6. Tape feeder 9 is installed on feeder base 5a so that the feeder controller built in tape feeder 9 is electrically connected to mounting controller 21 (see FIG. 5) of component mounters M3 to M6. Component supply carriage 5 holds reel 16 that stores carrier tape 15 in a state where carrier tape 15 is wound. Carrier tape 15 picked up from reel 16 is installed on tape feeder 9. Tape feeder 9 pitch-feeds carrier tape 15 to the component pick-up position using suction nozzle 12b.

As described above, component supply carriage 5, which can dispose the plurality of the component suppliers (tape feeders 9) for supplying component D, can be attached and detached to and from component mounter M3. As described above, in component mounter M3, board transport mechanism 7, the component mounting mechanism (Y-axis beam 10, X-axis beam 11, and mounting head 12), component recognition camera 13, and board recognition camera 14 configure component mounting work unit 17 (see FIG. 5) that mounts component D supplied by component supplying units 8(1) and 8(2) on transported board B by transporting board B.

Next, a configuration of a control system of component mounting system 1 will be described with reference to FIG. 5. Component mounting lines L1 to L3 included in component mounting system 1 have the same configuration and, hereinafter, component mounting line L1 will be described. Component mounters M3 to M6 included in component mounting line L1 have the same configuration and, hereinafter, component mounter M3 will be described.

Figure 5:
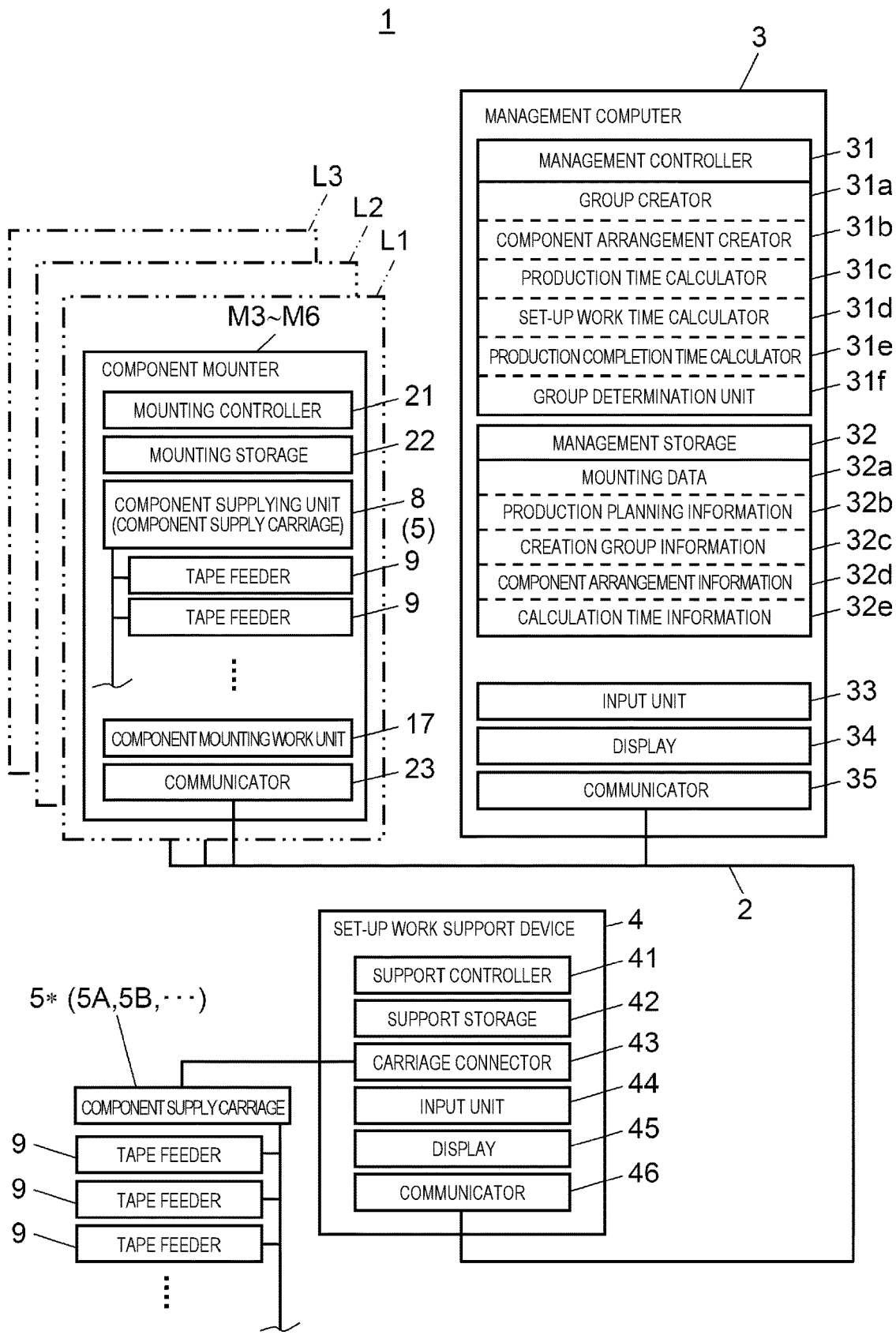
FIG. 5 is a block diagram illustrating a configuration of a control system of the component mounting system of an embodiment of the disclosure.

In FIG. 5, component mounter M3 has mounting controller 21, mounting storage 22, component supplying unit 8, component mounting work unit 17, and communicator 23. Communicator 23 is a communication interface and performs receiving and transmitting a signal or data between other component mounters M4 to 6, other component mounting lines L2 and L3, and management computer 3 via communication network 2. Mounting controller 21 executes the component mounting work by component mounter M3 by controlling tape feeder 9 installed on component supplying unit 8 and component mounting work unit 17 based on component mounting data stored in mounting storage 22.

In FIG. 5, management computer 3 has management controller 31, management storage 32, input unit 33, display 34, and communicator 35. Input unit 33 is an input device such as a keyboard, a touch panel, or a mouse, and is used when inputting an operation command or data. Display 34 is a display device such as a liquid crystal panel and displays various types of information of an operation screen for operation by input unit 33 and the like. Communicator 35 is a communication interface and performs receiving and transmitting a signal or data between component mounters M3 to M6 of component mounting lines L1 to L3 and set-up work support device 4 via communication network 2.

Management controller 31 is an arithmetic apparatus such as a CPU and manages component mounting system 1 based on information stored in management storage 32. Management controller 31 has group creator 31a, component arrangement creator 31b, production time calculator 31c, set-up work time calculator 31d, the production completion time calculator 31e, and group determination unit 31f as an internal processing function. Management storage 32 is a storage device and stores mounting data 32a, production planning information 32b, creation group information 32c, component arrangement information 32d, calculation time information 32e, and the like.

In FIG. 5, mounting data 32a is data such as the type of the component of mounted component D or the mounting point in board B, and is stored for each mounting board V of the production target. Production planning information 32b stores a production plan including types of mounting boards V and the number of productions produced in component mounting lines L1 to L3, or the like which is planned for a predetermined period of time (for example, one day) in component mounting system 1.

Group creator 31a combines a plurality of types of mounting boards V that are the production targets in component mounting lines L1 to L3 based on mounting data 32a and production planning information 32b, creates a plurality of groups G of the common arrangement in which the arrangement of tape feeder 9 (component supplier) is common in component mounters M3 to M6, and stores the plurality of groups G in management storage 32 as creation group information 32c. Component arrangement creator 31b creates the component arrangement for each group G in association with spare carriage 5* (component supply carriage 5) installed on component supplying units 8 of component mounters M3 to M6 included in component mounting lines L1 to L3 tape feeder 9 (component D) mounted on spare carriage 5* (component supply carriage 5) based on mounting data 32a and creation group information 32c, and stores the component arrangement in management storage 32 as component arrangement information 32d.

In FIG. 5, production time calculator 31c calculates production time Tv necessary when mounting board V of the number of productions planned in component mounting lines L1 to L3 in which tape feeder 9 (component D) is arranged according to the created component arrangement for each mounting board V based on mounting data 32a, production planning information 32b, and component arrangement information 32d, and stores production time Tv in management storage 32 as calculation time information 32e. That is, production time calculator 31c calculates production time Tv of mounting board V in group G created by group creator 31a.

Set-up work time calculator 31d calculates the external set-up work time Tw for the external set-up work and internal set-up work time Tc for the internal set-up work based on mounting data 32a, creation group information 32c, and component arrangement information 32d, and stores external set-up work time Tw and internal set-up work time Tc in calculation time information 32e. That is, set-up work time calculator 31d has functions as the internal set-up work calculator which calculates external set-up work time Tw for the external set-up work and the set-up changing work time calculator which calculates internal set-up work time Tc for the internal set-up work.

The external set-up work is work in which tape feeder 9 (component supplier) used in group G that is the next production target of group G in the production in component mounting lines L1 to L3 is arranged (installed) in component supply carriage 5 (spare carriage 5*) removed from component mounting lines L1 to L3 according to the component arrangement. In component mounting system 1 of the embodiment, the external set-up work is executed with respect to spare carriage 5* which is connected to set-up work support device 4 of external set-up area Ap.

The internal set-up work is performed for the set-up change of component mounting lines L1 to L3 for group G that is the next production target, and is work for replacing component supply carriage 5 installed on component mounters M3 to M6 to spare carriage 5* (component supply carriage 5) in which tape feeder 9 used in group G that is the next production target by the external set-up work is disposed.

In FIG. 5, production completion time calculator 31e calculates production completion time Tf at which the production of all mounting boards V that are the production targets is completed based on production time Tv, external set-up work time Tw, and internal set-up work time Tc included in calculation time information 32e, and stores production completion time Tf in calculation time information 32e.

Group determination unit 31f repeatedly executes the creation of group G by group creator 31a, the calculation of production time Tv by production time calculator 31c, the calculation of external set-up work time Tw and internal set-up work time Tc by set-up work time calculator 31d, and the calculation of production completion time Tf by production completion time calculator 31e, and determines group G so that production completion time Tf is shortened.

Here, group G of mounting board V, production time Tv, external set-up work time Tw, internal set-up work time Tc, and production completion time Tf will be described with reference to FIG. 6. Here, an example in which five types of mounting boards V1 to V5 are produced in component mounting line L1 will be described.

Figure 6:
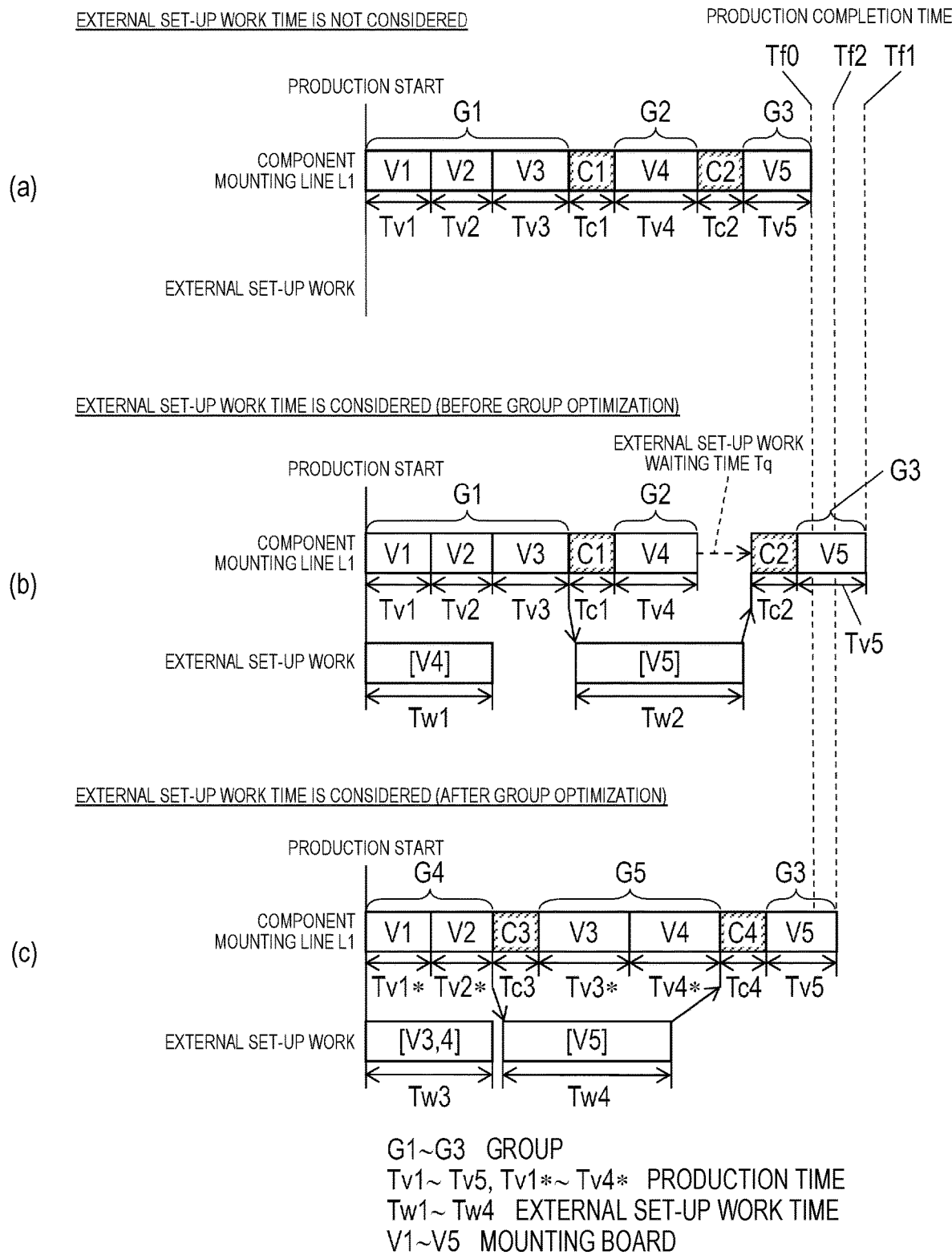
FIG. 6 is an explanatory view of a production time and a group in the component mounting system of an embodiment of the disclosure.

In (a) of FIG. 6, on the premise that external set-up work time Tw does not affect production completion time Tf, group G of the common arrangement is created so that production completion time Tf0 is shortened. A case where external set-up work time Tw does not affect production completion time Tf is an ideal condition, in which, for example, there are spare carriages 5* having the same number as that of component supply carriages 5 installed on component mounting line L1, many workers performing the external set-up work are assigned, and spare carriage 5* having components for next group G can be always prepared when the set-up is executed in component mounting line L1.

Under this condition, the five types of mounting boards V1 to V5 are divided into three groups G1 to G3 by group creator 31a. That is, mounting boards V1 to V3 is divided into group G1, mounting board V4 is divided into group G2, and mounting board V5 is divided into group G3. In a case where mounting boards V1 to V5 of the number of the productions planned in the component arrangement corresponding to each of groups G1 to G3 created by component arrangement creator 31b are produced, production times Tv1 to Tv5 are calculated for each of mounting boards V1 to V5 by production time calculator 31c.

Internal set-up work time Tc1 necessary for set-up change C1 for changing the component arrangement of component mounting line L1 from group G1 to group G2, and internal set-up work time Tc2 necessary for set-up change C2 for changing the component arrangement from group G2 to group G3 are calculated by set-up work time calculator 31d. Production completion time Tf0 until the production of all mounting boards V1 to V5 is completed is calculated by production completion time calculator 31e. That is, production completion time Tf0 is a sum of production times Tv1 to Tv5 and internal set-up work times Tc1 and Tc2. Production completion time Tf0 which is produced under this condition is an ideal value of production completion time Tf.

(b) of FIG. 6 illustrates production completion time Tf1 in consideration of external set-up work time Tw before the group optimization. Groups G1 to G3 has the same condition as the ideal condition illustrated in (a) of FIG. 6 before the group optimization. Production completion time Tf1 is calculated based on the number of component supply carriages 5 and spare carriages 5* actually prepared, and the number of the workers assigned to the external set-up work. Production times Tv1 to Tv5 and internal set-up work times Tc1 and Tc2 are the same as those of (a) of FIG. 6. External set-up work time Tw1 for performing the component arrangement in spare carriage 5* for group G2 (mounting board V4) and external set-up work time Tw2 for performing the component arrangement for group G3 (mounting board V5) are calculated by set-up work time calculator 31d.

The external set-up work is started when spare carriage 5* necessary for the external set-up work is prepared in external set-up area Ap. In the example illustrated in (b) of FIG. 6, spare carriages 5* of the number thereof necessary for the external set-up work for group G2 is prepared in external set-up area Ap when the production of group G1 is started, and the external set-up work for group G2 is completed before the production completion of group G1 which is started simultaneously with the production start of group G1. At a time point at which the external set-up work for group G2 is completed, in a case where spare carriage 5* for group G3 is prepared in external set-up area Ap, the external set-up work for group G3 can be started before the production completion of group G1.

In the example illustrated in (b) of FIG. 6, since the number of spare carriages 5* is not enough, spare carriage 5* for group G3 is not prepared at the time point at which the external set-up work for group G2 is completed and component supply carriage 5 used for the production of group G1 is diverted. Therefore, the external set-up work for group G3 is started after waiting for component supply carriage 5 used for the production of group G1 to be removed and carried into external set-up area Ap, and is not completed at the time point at which the production of group G2 is completed. In the embodiment, set-up work time calculator 31d calculates external set-up work time Tw using the time point at which spare carriages 5* of the number thereof is necessary for the external set-up work as the start time point of the external set-up work.

Production completion time calculator 31e calculates production completion time Tf1 under a condition that set-up changes C1 and C2 are started if spare carriages 5* for next groups G2 and G3 can be prepared based on production times Tv1 to Tv5 and internal set-up work times Tc1 and Tc2, and external set-up work times Tw1 and Tw2. Specifically, the completion time point of external set-up work time Tw1 for group G2 (mounting board V4) is earlier than the completion time point of the production of mounting boards V1 to V3 of group G1.

Therefore, set-up change C1 for changing component mounting line L1 from group G1 to group G2 is started immediately after the production completion of mounting board V3. The external set-up work for next group G3 (mounting board V5) is also started in parallel. More specifically, component supply carriages 5 which are removed by component mounters M3 to M6 of component mounting line L1 are transported to external set-up area Ap, and are connected to set-up work support device 4, and the external set-up work thereof is performed.

On the other hand, the completion time point of external set-up work time Tw2 for group G3 (mounting board V5) is later than the completion time point of the production of mounting board V4 of group G2. Therefore, external set-up work waiting time Tq, at which the production of mounting board V is stopped from the production completion of mounting board V4 to the start of set-up change C2 to group G3, is generated (Tq=Tw2−(Tc1+Tv4)). Production completion time Tf1, which is obtained by adding external set-up work waiting time Tq to the sum (production completion time Tf0) of production times Tv1 to Tv5 and internal set-up work times Tc1 and Tc2, is calculated by production completion time calculator 31e.

As described above, production completion time calculator 31e calculates production completion time Tf1, at which the production of all mounting boards V1 to V5 is completed, including external set-up work waiting time Tq at which component mounting line L1 is paused (production is stopped) due to the completion of the external set-up work to group G3 that is the next production target to be later than the completion of the production of mounting board V4 in group G2 under production based on the number of component supply carriages 5 including spare carriage 5* that can be used for production. In the example, production completion time Tf1 (Tf1=Tf0±Tq) before the group optimization is longer than ideal production completion time Tf0.

(c) of FIG. 6 illustrates production completion time Tf2 in consideration of external set-up work time Tw after the group optimization. That is, production completion time Tf2 is illustrated after groups G3 to G5 are optimized by group determination unit 31f so that production completion time Tf2 can be as short as possible. In the example, the order of the productions of mounting boards V1 to V5 is not changed, mounting boards V1 and V2 are divided into group G4, and mounting boards V3 and V4 are divided into group G5. Mounting board V5 is the identification information group G3 that is same as that of (a) of FIG. 6 and (b) of FIG. 6.

Production times Tv1* to Tv4* are recalculated by production time calculator 31c for each of mounting boards V1 to V4 in a case where mounting boards V1 to V4, which are planned in a new component arrangement created by component arrangement creator 31b corresponding to groups G4 and G5 which are newly created, are produced. Production times Tv1* to Tv4* may be longer than original production times Tv1 to Tv4 because the component arrangement is changed from an ideal state.

External set-up work time Tw3 for performing the component arrangement for group G5 (mounting boards V3 and V4) and external set-up work time Tw4 for performing the component arrangement for group G3 (mounting board V5) in spare carriage 5* are calculated by set-up work time calculator 31d. External set-up work time Tw4 for group G3 is different from external set-up work time Tw2 for group G3 of (b) of FIG. 6 because component supply carriage 5 in which the component arrangement is performed for group G4 is removed and the component arrangement for group G3 is changed. Internal set-up work time Tc3 necessary for set-up change C3 for changing the component arrangement of component mounting line L1 from group G4 to group G5 and internal set-up work time Tc4 necessary for set-up change C4 for changing the component arrangement thereof from group G5 to group G3 are calculated by set-up work time calculator 31d.

In (c) of FIG. 6, the completion time point of external set-up work time Tw3 for group G5 (mounting boards V3 and V4) is earlier than the completion time point of the production of mounting boards V1 and V2 of group G4. The completion time point of external set-up work time Tw4 for group G3 (mounting board V5) is also earlier than the completion time point of the production of mounting boards V3 and V4 of group G5. Therefore, external set-up work waiting time Tq is not generated and production completion time Tf2, which is obtained by adding production times Tv1* to Tv4*, and Tv5, and internal set-up work times Tc3 and tc4, is calculated by production completion time calculator 31e.

As described above, group creator 31a changes mounting boards V1 to V4 to new two groups G4 and G5 including mounting board V4 of group G2 related to the generation of external set-up work waiting time Tq in (b) of FIG. 6. That is, group creator 31a changes mounting board V4 included in group G2 related to external set-up work waiting time Tq to another group G5. Therefore, production times Tv1* to Tv4* of mounting boards V1 to V4 may be longer than original production times Tv1 to Tv4 respectively, but external set-up work waiting time Tq is not generated. In the example, production completion time Tf2 after the group optimization is longer than ideal production completion time Tf0, but is shorter than production completion time Tf1 before the group optimization (Tf0<Tf2<Tf1).

As described above, management computer 3 of the embodiment is a group determination apparatus which includes the external set-up work time calculator (set-up work time calculator 31d) which calculates external set-up work time Tw for the external set-up work by which the component supplier (tape feeder 9) used in group G that is the next production target is arranged in spare carriage 5* (component supply carriage 5), production completion time calculator 31e which calculates production completion time Tf of all mounting boards V that are the production targets in consideration of external set-up work time Tw, and group determination unit 31f which determines group G so that production completion time Tf is shortened. It is possible to determine group G, in which the component arrangement having high productivity is common, by the group determination apparatus.

In FIG. 5, set-up work support device 4 has support controller 41, support storage 42, carriage connector 43, input unit 44, display 45, and communicator 46. Input unit 44 is an input device such as a keyboard, a touch panel, or a mouse, and is used when inputting an operation command or data. Display 45 is a display device such as a liquid crystal panel and displays various screens such as an operation screen for operation by input unit 44 and various types of information such as a procedure of the set-up work and the progress status of the set-up work.

Communicator 46 is a communication interface and performs receiving and transmitting of a signal or data from/to management computer 3 via communication network 2. Support controller 41 is an arithmetic apparatus such as a CPU and controls set-up work support device 4 based on information stored in support storage 42. Support storage 42 is a storage device and stores the component arrangement, the set-up work procedure, or the like. Carriage connector 43 is connected to spare carriage 5* (component supply carriages 5A and 5B, or the like of FIG. 1). Carriage connector 43 communicates with a feeder controller built in each tape feeder 9 installed on component supply carriage 5 via component supply carriage 5.

The group determination method for dividing the plurality of types of mounting boards V that are production targets into the plurality of groups G in which the arrangement of component suppliers (tape feeders 9) is common in component mounters M3 to M6, in component mounting lines L1 to L3 will be described with reference to FIG. 6 in accordance with the flows of FIG. 7. First, ideal production completion time Tf0 (see (a) of FIG. 6) is calculated (ST1).

Figure 8:
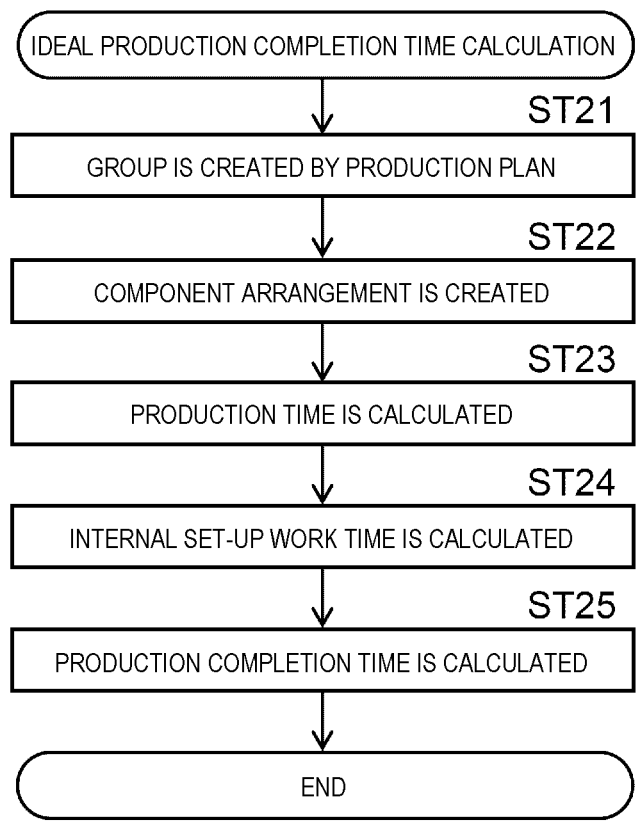
FIG. 8 is a flowchart of an ideal production completion time calculation in the component mounting system of an embodiment of the disclosure.

Here, details of the ideal production completion time calculation (ST1) will be described with reference to FIG. 8. First, group creator 31a creates the plurality of groups G by combining the plurality of types of mounting boards V that are the production targets based on the production plan included in production planning information 32b (ST21: initial group creation step). Created group G is stored in creation group information 32c. Next, component arrangement creator 31b creates the component arrangement corresponding to created group G for each group G (ST22: component arrangement creation step).

Next, production time calculator 31c calculates production time Tv of mounting board V in the component arrangement of created group G for each mounting board V (ST23: production time calculation step). Next, set-up work time calculator 31d calculates internal set-up work time Tc (ST24: internal set-up work time calculation step). Next, production completion time calculator 31e calculates ideal production completion time Tf0 based on production time Tv and internal set-up work time Tc (ST25: production completion time calculation step).

Figure 7:
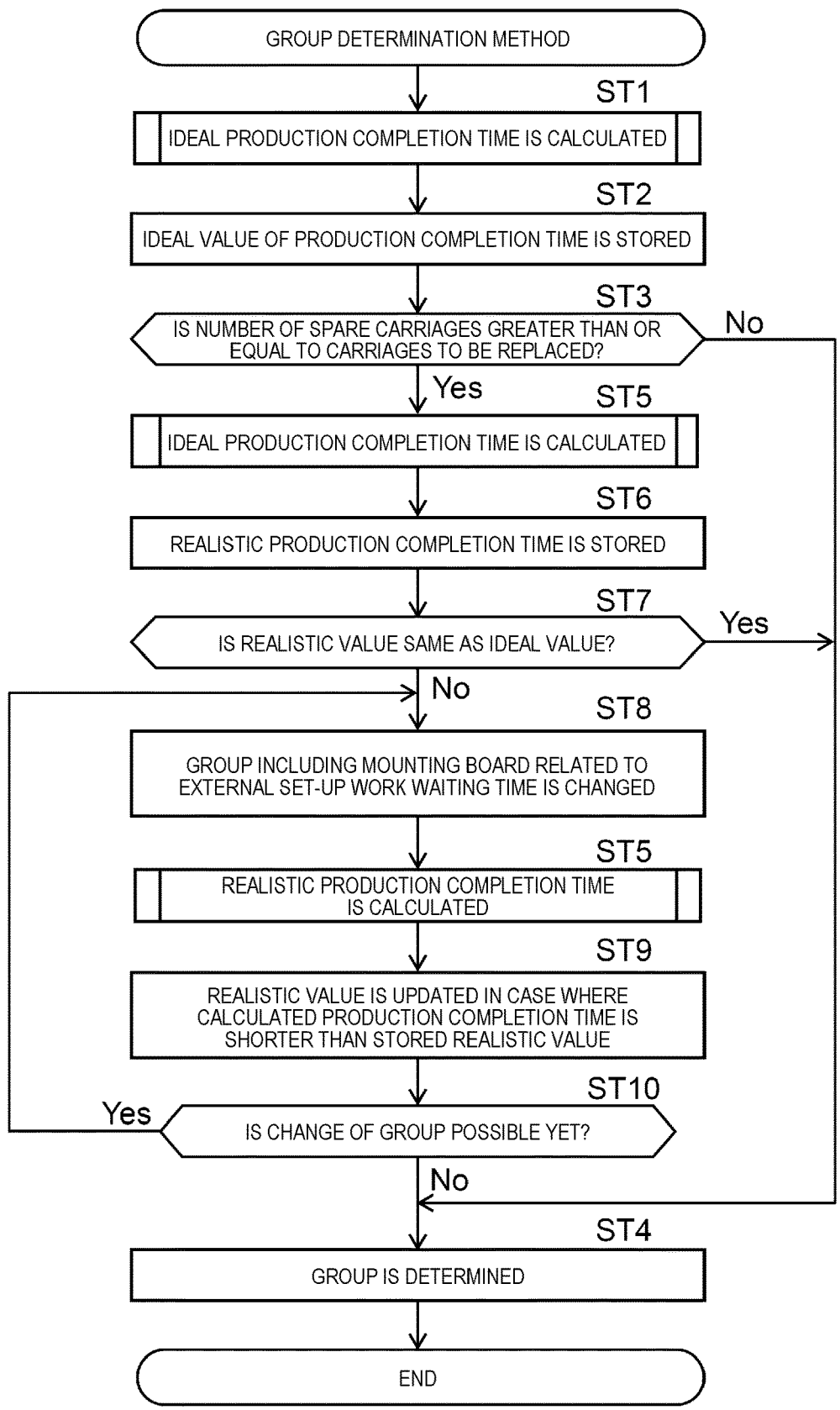
FIG. 7 is a flowchart of a group determination method in the component mounting system of an embodiment of the disclosure.

In FIG. 7, calculated ideal production completion time Tf0 is stored in calculation time information 32e (ST2). Next, group determination unit 31f determines whether or not the number of spare carriages 5* is the number of component supply carriages 5 or more that are replacement targets among component supply carriages 5 installed on component mounters M3 to M6 (ST3). In a case where the number of spare carriages 5* is smaller than the number of component supply carriages 5 that are the replacement targets (No in ST3), component supply carriages 5 are installed on component mounters M3 to M6 again by performing the next component arrangement to component supply carriages 5 removed from component mounters M3 to MG. Therefore, since there is no room for the group optimization, group determination unit 31f determines that group G is group G in which ideal production completion time Tf0 is calculated (ST4: group determination step).

In a case where the number of spare carriages 5* is greater than or equal to the number of component supply carriages 5 that are the replacement targets (Yes in ST3), realistic production completion time Tf1 (see (b) of FIG. 6) is calculated (ST5). Here, details of the realistic production completion time calculation (ST5) will be described with reference to FIG. 9. The realistic production completion time calculation (ST5) is different from the ideal production completion time calculation (ST1) in consideration of external set-up work time Tw. Hereinafter, the same reference numerals are given to the same steps of the ideal production completion time (ST1) and detailed description will be omitted.

Figure 9:
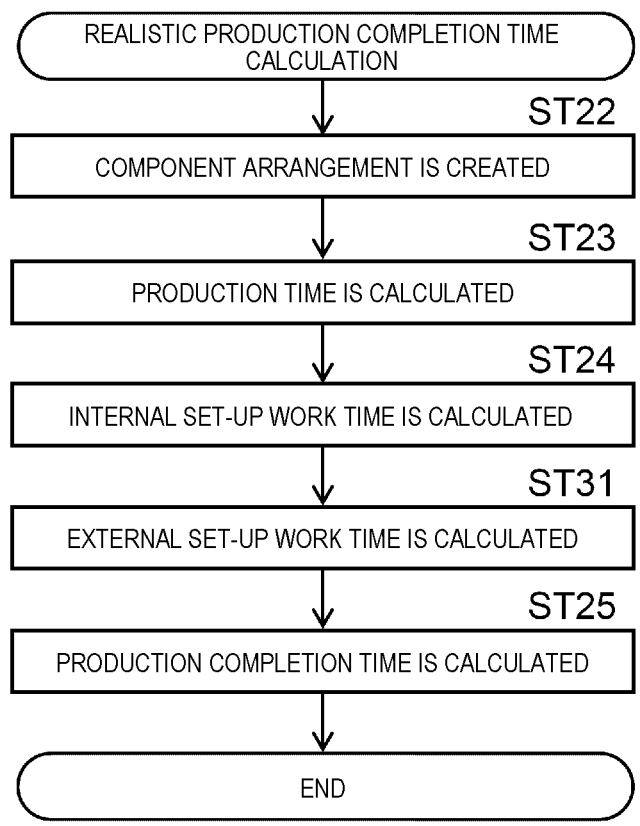
FIG. 9 is a flowchart of a realistic production completion time calculation in the component mounting system of an embodiment of the disclosure.

In FIG. 9, the component arrangement creation step (ST22), the production time calculation step (ST23), and the internal set-up work time calculation step (ST24) are executed with respect to same group G as the ideal production completion time calculation (ST1) stored in creation group information 32c. Next, set-up work time calculator 31d calculates external set-up work time Tw for the external set-up work for arranging tape feeder 9 (component supplier) that is used in group G that is the next production target of group G under production in component mounting lines L1 to L3 in component supply carriage 5 (spare carriage 5*) which is removed from component mounting lines L1 to L3 (ST31: external set-up work time calculation step).

Next, the production completion time calculation step (ST25) is executed. Here, production completion time calculator 31e calculates production completion time Tf based on production time Tv, internal set-up work time Tc, external set-up work time Tw, and external set-up work waiting time Tq. Production completion time calculator 31e calculates production completion time Tf using the time point at which spare carriages 5* of the number thereof is necessary for the external set-up work as the start time point of external set-up work time Tw.

In FIG. 7, calculated realistic production completion time Tf1 is stored in calculation time information 32e (ST6). Next, group determination unit 31f determines whether or not realistic production completion time Tf1 is the same as ideal production completion time Tf0 (ST7). If it is the same (Yes in ST7), the procedure proceeds to the group determination step (ST4) and group determination unit 31f determines group G is group G which is calculated at ideal production completion time Tf0. In a case where realistic production completion time Tf1 is longer than ideal production completion time Tf0 (No in ST7), group optimization which is described later is executed.

In the group optimization, first, group creator 31a changes mounting board V included in group G related to external set-up work waiting time Tq ((ST8: group creation step) (see (c) of FIG. 6). That is, mounting board V included in group G related to external set-up work waiting time Tq is changed to another group G and the plurality of groups G, in which the plurality of types of mounting boards V that are the production targets are combined, are created. Created group G is stored in creation group information 32c.

In FIG. 7, the realistic production completion time calculation (ST5) corresponding to next created group G is executed and production completion time Tf2 is calculated. Next, in a case where calculated realistic production completion time Tf2 is shorter than stored realistic production completion time Tf1, group determination unit 31f updates production completion time Tf1 stored in calculation time information 32e to production completion time Tf2 in association with newly created group G of creation group information 32c.

Next, group determination unit 31f determines whether or not the change of next group G can be performed (ST10) yet. In a case where the change can be performed (Yes in ST10), the procedure returns to the group creation step (ST8) to change the division of group G and production completion time Tf is calculated. In a case where the possible group optimization is ended (No in ST10), the procedure proceeds to the group determination step (ST4) and group determination unit 31f determines group G is group G in which realistic production completion time Tf is shortest.

As described above, in the group optimization, the group creation step (ST8), the production time calculation step (ST23 of ST5), the external set-up work time calculation step (ST31 of ST5), and the production completion time calculation step (ST25 of ST5) are repeated and group G is determined so that production completion time Tf is shortened. Therefore, it is possible to determine group G of the common arrangement capable of obtaining productivity higher than that of the related art.

In the group optimization of the embodiment, group G is determined under the condition that the order of the production of mounting boards V is not changed from the production plan, but the group optimization is not limited thereto. For example, group G may be determined to be group G of the common arrangement in which production completion time Tf is shortened under a condition in which the production order of mounting boards V is changed in a range in which the type and the production number of mounting boards V to be produced on a day.

SUMMARY

As described above, the group determination method of the embodiment is a group determination method for dividing the plurality of types of mounting boards V that are production targets into the plurality of groups G in which the arrangement of the plurality of component suppliers is common in the plurality of component mounters, in component mounting line L1 including the plurality of the component mounters capable of attaching and detaching component supply carriage 5, which can dispose the plurality of the component suppliers (tape feeders 9) for supplying components. The group determination method includes the external set-up work time calculation step (ST31 of ST5) for calculating external set-up work time Tw for the external set-up work for arranging the component suppliers (tape feeders 9) to be used in group G that is the next production target of group G under production in component mounting line L1 to spare carriage 5* (component supply carriage 5) removed from component mounting line L1; and the production completion time calculation step (ST25 of ST5) for calculating production completion time Tf at which production of all mounting boards V1 to V5 that are the production targets is completed in consideration of external set-up work time Tw. The plurality of groups G in which the arrangement of component suppliers is common are determined in the plurality of types of mounting boards V that are the production targets so that production completion time Tf is shortened.

The group determination apparatus of the embodiment is a group determination apparatus which divides the plurality of types of mounting boards V that are production targets into the plurality of groups in which the arrangement of the plurality of component supplier is common in the plurality of component mounters, component mounting line L1 including the plurality of the component mounters capable of attaching and detaching component supply carriage 5, which can dispose the plurality of the component suppliers (tape feeders 9) for supplying components. The group determination apparatus includes external set-up work time calculator 31d which calculates external set-up work time Tw for the external set-up work by which the component suppliers (tape feeders 9) to be used in group G that is the next production target of group G under production in component mounting line L1 is arranged in spare carriage 5* (component supply carriage 5); production completion time calculator 31e which calculates production completion time Tw of all mounting boards V that are the production targets in consideration of external set-up work time Tw; and group determination unit 31f which determines the plurality of groups G in which the arrangement of the component suppliers is common in the plurality of types of mounting boards V so that the production completion time Tf is shortened.

The group determination method and the group determination apparatus of the disclosure have an effect that it is possible to determine the group in which the common arrangement, which is capable of obtaining the productivity higher than that of the related art, is common, and are effective in a component mounting field in which a component is mounted on a board.

What is claimed is:

1. A group determination method, the method comprising:
a step of grouping a plurality of types of mounting boards that are production targets into a sequential combination of a plurality of groups of mounting boards, each group being common in an arrangement of a plurality of component suppliers, in a component mounting line including a plurality of component mounters, each component mounter including a component supply carriage capable of attaching and detaching the plurality of the component suppliers for supplying components,
a step of calculating an external set-up work time for an external set-up work by which component suppliers to be used in a group that is a next production target of a group under production in the component mounting line are arranged in a component supply carriage when the component supply carriage is removed from the component mounting line; and
a step of calculating a production completion time at which production of all the mounting boards that are the production targets is completed in consideration of the external set-up work time,
a step of determining a sequential combination of a plurality of groups of mounting boards that causes a production completion time to be shortened from the calculated production completion time by re-grouping the plurality of types of mounting boards.

2. The group determination method of claim 1, wherein in the production completion time calculation step, the production completion time is calculated including an external set-up work waiting time during which the component mounting line is paused due to a fact that completion of the external set-up work is later than completion of production of the mounting boards in the group under production, based on a number of component supply carriages that can be used for the production.

3. The group determination method of claim 1, further comprising:
wherein a sequential combination of a plurality of groups is determined so that the production completion time is shortened by repeating the grouping step, the external set-up work time calculation step, and the production completion time calculation step.

4. The group determination method of claim 3, wherein in the grouping step, a mounting board included in a group related to an external set-up work waiting time is changed to be included in another group.

* * * * *